United States Patent
Abe et al.

(10) Patent No.: US 10,355,155 B2
(45) Date of Patent: Jul. 16, 2019

(54) METHOD OF PRODUCING GLASS BASE MATERIAL LAMINATE, METHOD OF PRODUCING OPTICAL ELEMENT, OPTICAL ELEMENT, AND CONCENTRATING PHOTOVOLTAIC DEVICE

(71) Applicant: KURARAY CO., LTD., Kurashiki-shi (JP)

(72) Inventors: Koji Abe, Kamisu (JP); Shinji Hiramatsu, Kamisu (JP); Katsuhiro Fujita, Kamisu (JP)

(73) Assignee: KURARAY CO., LTD., Kurashiki-shi (JP)

( * ) Notice: Subject to any disclaimer, the term of this patent is extended or adjusted under 35 U.S.C. 154(b) by 243 days.

(21) Appl. No.: 15/110,036

(22) PCT Filed: Dec. 26, 2014

(86) PCT No.: PCT/JP2014/084553
§ 371 (c)(1),
(2) Date: Jul. 6, 2016

(87) PCT Pub. No.: WO2015/102093
PCT Pub. Date: Jul. 9, 2015

(65) Prior Publication Data
US 2016/0329450 A1    Nov. 10, 2016

(30) Foreign Application Priority Data
Jan. 6, 2014    (JP) .................................. 2014-000581

(51) Int. Cl.
*B32B 37/06*    (2006.01)
*H01L 31/054*    (2014.01)
(Continued)

(52) U.S. Cl.
CPC ........ *H01L 31/0543* (2014.12); *B32B 17/064* (2013.01); *B32B 37/06* (2013.01);
(Continued)

(58) Field of Classification Search
CPC ....... B32B 17/064; B32B 37/06; B32B 37/10; B32B 37/12; B32B 37/14
See application file for complete search history.

(56) References Cited

U.S. PATENT DOCUMENTS

2006/0208374 A1 * 9/2006 Shimotsuma ......... B29C 39/026
                                                                                264/1.7
2009/0305068 A1    12/2009 Morishita et al.
(Continued)

FOREIGN PATENT DOCUMENTS

CN    101548204 A    9/2009
CN    102202876 A    9/2011
(Continued)

OTHER PUBLICATIONS

Combined Office Action and Search Report dated Feb. 28, 2017 in Chinese Patent Application No. 201480072393.5 (with English translation of categories of cited documents).
(Continued)

*Primary Examiner* — Daniel McNally
(74) *Attorney, Agent, or Firm* — Oblon, McClelland, Maier & Neustadt, L.L.P.

(57) ABSTRACT

A method of producing an optical element, which includes a glass substrate and a sheet-like formed body, is provided. The sheet-like formed body is formed of an organic resin, one surface of which has a fresnel lens pattern and the other surface of which is bonded to the glass substrate. The sheet-like formed body is a thermoplastic polymer composition. A bonding surface of the sheet-like formed body facing the glass substrate is treated by irradiating active
(Continued)

energy. A bonding surface of the glass substrate facing the sheet-like formed body is bonded to the bonding surface of the sheet-like formed body by using a silane coupling agent as a crosslinking agent.

16 Claims, 2 Drawing Sheets

(51) Int. Cl.
*G02B 3/08* (2006.01)
*B32B 37/10* (2006.01)
*B32B 37/12* (2006.01)
*B32B 37/14* (2006.01)
*G02B 5/20* (2006.01)
*G02B 19/00* (2006.01)
*B32B 17/06* (2006.01)
*G02B 1/04* (2006.01)
*H01L 51/44* (2006.01)

(52) U.S. Cl.
CPC ............. *B32B 37/10* (2013.01); *B32B 37/12* (2013.01); *B32B 37/14* (2013.01); *G02B 1/04* (2013.01); *G02B 3/08* (2013.01); *G02B 5/208* (2013.01); *G02B 19/0014* (2013.01); *G02B 19/0042* (2013.01); *B32B 2551/00* (2013.01); *H01L 51/447* (2013.01); *Y02E 10/52* (2013.01)

(56) References Cited

U.S. PATENT DOCUMENTS

| | | | |
|---|---|---|---|
| 2010/0110567 A1* | 5/2010 | Glacet | B29D 11/0073 359/742 |
| 2010/0159183 A1* | 6/2010 | Nishimura | B29C 45/14639 428/77 |
| 2011/0218303 A1* | 9/2011 | Oshima | C08J 5/18 525/94 |
| 2011/0230609 A1 | 9/2011 | Oshita et al. | |
| 2011/0242657 A1 | 10/2011 | Glacet et al. | |
| 2012/0160300 A1* | 6/2012 | Munro | H01L 31/0687 136/246 |
| 2012/0273975 A1 | 11/2012 | Hayashishita et al. | |
| 2013/0056049 A1 | 3/2013 | Nakata et al. | |
| 2015/0179856 A1 | 6/2015 | Abe et al. | |
| 2016/0002504 A1 | 1/2016 | Glacet et al. | |

FOREIGN PATENT DOCUMENTS

| | | |
|---|---|---|
| CN | 102209753 A | 10/2011 |
| EP | 2345698 A1 | 7/2011 |
| EP | 2 366 750 A1 | 9/2011 |
| ES | 2461498 T3 | 5/2014 |
| JP | 60-2358 A | 1/1985 |
| JP | 2006-343435 A | 12/2006 |
| JP | 2007-212771 A | 8/2007 |
| JP | 2010-251679 A | 11/2010 |
| KR | 10-2011-0074579 A | 6/2011 |
| KR | 10-2013-0054288 A | 5/2013 |
| TW | 201026772 A1 | 7/2010 |
| TW | 201041846 A1 | 12/2010 |
| TW | 201409087 A | 3/2014 |
| WO | WO 2009/054553 A2 | 4/2009 |
| WO | 2010/055798 A1 | 5/2010 |
| WO | WO 2010/095475 A1 | 8/2010 |
| WO | WO 2011/152045 A1 | 12/2011 |
| WO | 2014/010571 A1 | 1/2014 |

OTHER PUBLICATIONS

Extended European Search Report dated Aug. 4, 2017 in European Patent Application No. 14875998.8.
Korean Office Action dated Jan. 22, 2018 in Korean Patent Application No. 10-2016-7021493, 10 pages.
Office Action dated May 2, 2018 in Korean Patent Application No. 10-2016-7021493.
Office Action dated Apr. 30, 2018 in Taiwanese Patent Application No. 104100017 with English translation of categories of cited documents, 4 pages.
International Search Report dated Mar. 24, 2015 in PCT/JP2014/084553 filed Dec. 26, 2014.

* cited by examiner

FIG.3B

METHOD OF PRODUCING GLASS BASE MATERIAL LAMINATE, METHOD OF PRODUCING OPTICAL ELEMENT, OPTICAL ELEMENT, AND CONCENTRATING PHOTOVOLTAIC DEVICE

CROSS-REFERENCE TO RELATED APPLICATION

The present application is based on and claims priority from Japanese Patent Application No. 2014-000581, filed on Jan. 6, 2014, the disclosure of which is hereby incorporated by reference in its entirety.

TECHNICAL FIELD

This invention is related to a method of producing a glass base material laminate, a method of producing an optical element, an optical element, and a concentrating photovoltaic device.

Recently, utilizing natural energy has drawn a lot of attention. For instance, a solar photovoltaic power generation device to convert solar energy into electric power using solar cells has been known. As an example of such a photovoltaic power generation device, there is known a concentrating photovoltaic device configured to include a plurality of solar cell elements arranged in a single plane and optical elements (condenser lenses) disposed in front of the solar cell elements for concentrating sunlight on the corresponding solar cell elements so as to increase the power generation efficiency (i.e., photoelectric conversion efficiency) to obtain large electric power (see Patent Literature 1, JP2006-343435 A, for example).

Concentrating photovoltaic power generation devices are configured to collect sunlight using optical elements (condenser lenses) and to receive the collected sunlight by solar cell elements. With this, the devices can downsize the expensive solar cell elements, thereby reducing the cost of the entire power generation device. Hence, concentrating photovoltaic devices have been spread to supply electric power in areas which have long daylight hours and are vast enough to install the photovoltaic devices with an enlarged collecting surface thereof.

In the concentrating photovoltaic device disclosed in PL 1, a surface on the light incident surface side of the sheet optical element (condenser lens) formed of an acrylic resin (PMMA resin) is bonded with a transparent glass base material in consideration of the environmental resistance.

Here, to bond an optical member formed of acrylic resin (e.g., a sheet optical element), which has transparency and light stability, to a glass base material; a silicon adhesive and the like have been used. However, silicon adhesives do not last with high adhesiveness under high-temperature and high-humidity environment such as outside of a building.

With a surface activation treatment on a transparent acrylic resin, it is possible to obtain high adhesiveness with the glass base material for a short period of time without using an adhesive. However, the adhesion force decreases rapidly under a high-temperature and high-humidity environment with the lapse of time, and therefore the optical member may be separated from the glass base material.

If the adhesion force between the glass base material and the sheet-like optical element decreases and the bonding surface is separated, the photovoltaic power generation device becomes unable to efficiently collect sunlight on the solar cell elements. As a result, it reduces the power generation efficiency.

An object of the present invention is, therefore, to provide a method of producing a glass base material laminate, a method of producing an optical element, an optical element, and a concentrating photovoltaic device that can reliably bond a bonding surface between a glass base material and a transparent acrylic resin over a long period with high adhesiveness even under a high-temperature and high-humidity environment.

In order to achieve the above object, in a method of producing a glass base material laminate according to the present invention, the glass base material laminate is laminated with a resin molded body on a glass base material. The resin molded body is made of a thermoplastic polymer composition, and the thermoplastic polymer composition contains an acrylic block copolymer (A) or contains an acrylic block copolymer (A) and an acrylic resin (B) mainly composed of a methacrylic ester unit. The acrylic block copolymer (A) of the thermoplastic polymer composition includes, within its molecule, at least one structure in which a polymer block (a2) mainly composed of a methacrylic ester unit is bonded to each terminal of a polymer block (a1) mainly composed of an acrylic ester unit, the thermoplastic polymer composition having a weight-average molecular weight of 10,000 to 100,000. The method includes the steps of performing surface treatment on a first interface of the thermoplastic polymer composition facing the glass base material by irradiating the first interface with active energy; and, by using a silane coupling agent as a crosslinking agent, bonding the first interface of the thermoplastic polymer composition to a second interface of the glass base material facing the thermoplastic polymer composition.

Further, in a method of producing an optical element according to the present invention, the optical element includes a glass base material and a sheet-like formed body. Here, the sheet-like formed body is formed of an organic resin one surface of which has an optical functional pattern and the other surface of which is bonded to the glass base material. The sheet-like formed body is made of a thermoplastic polymer composition, and the thermoplastic polymer composition contains an acrylic block copolymer (A) or contains an acrylic block copolymer (A) and an acrylic resin (B) mainly composed of a methacrylic ester unit. The acrylic block copolymer (A) of the thermoplastic polymer composition includes, within its molecule, at least one structure in which a polymer block (a2) mainly composed of a methacrylic ester unit is bonded to each terminal of a polymer block (a1) mainly composed of an acrylic ester unit, the thermoplastic polymer composition having a weight-average molecular weight of 10,000 to 100,000. The method includes the steps of performing surface treatment on a first interface of the thermoplastic polymer composition facing the glass base material by irradiating the first interface with active energy; and, by using a silane coupling agent as a crosslinking agent, bonding the first interface of the thermoplastic polymer composition to a second interface of the glass base material facing the thermoplastic polymer composition.

Further, an optical element according to present invention includes a glass base material and a sheet-like formed body. Here, the sheet-like formed body is formed of an organic resin one surface of which has an optical functional pattern and the other surface of which is bonded to the glass base material. The sheet-like formed body is made of a thermoplastic polymer composition, and the thermoplastic polymer composition contains an acrylic block copolymer (A) or contains an acrylic block copolymer (A) and an acrylic resin (B) mainly composed of a methacrylic ester unit. The acrylic block copolymer (A) of the thermoplastic polymer composition includes, within its molecule, at least one structure in which a polymer block (a2) mainly composed of a methacrylic ester unit is bonded to each terminal of a polymer block (a1) mainly composed of an acrylic ester unit, the thermoplastic polymer composition having a weight-average molecular weight of 10,000 to 100,000. The first interface of the thermoplastic polymer composition is performed with surface treatment, and, by using a silane coupling agent as a crosslinking agent, the first interface of the thermoplastic polymer composition is bonded to a second interface of the glass base material facing the thermoplastic polymer composition.

Further, a concentrating photovoltaic device according to the present invention includes an optical element that collects sunlight and a solar cell element that receives the sunlight collected by the optical element and photoelectric-converts the receives sunlight. The optical element is the optical element recited in claim 15.

DESCRIPTION OF EMBODIMENT

Figure 1:
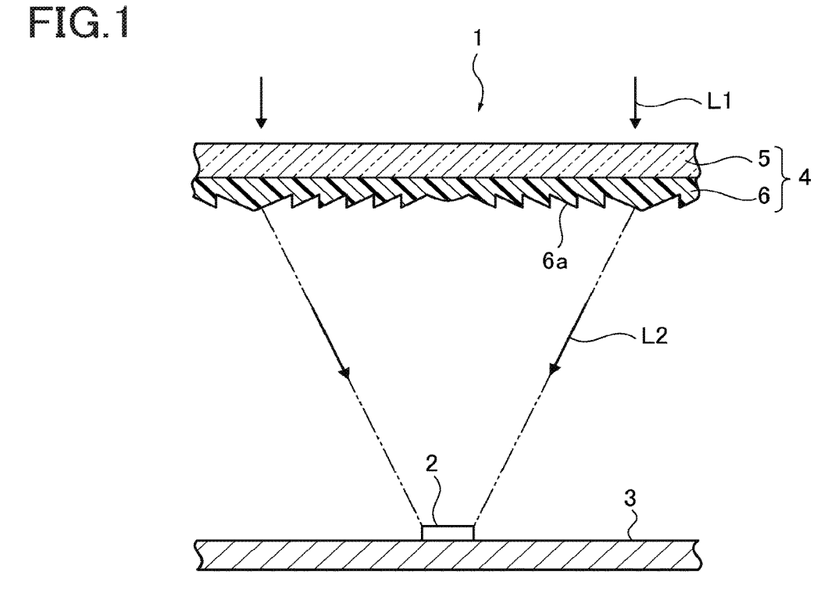
FIG. 1 is a view illustrating a schematic configuration of a concentrating photovoltaic device including an optical element according to an embodiment of the present invention.

Hereinafter, an illustrated embodiment of the present invention will be described. FIG. 1 is a schematic sectional views schematically illustrating a configuration of a concentrating photovoltaic device that includes an optical element according to the embodiment of the present invention.

Entire Configuration of the Concentrating Photovoltaic Device

As illustrated in FIG. 1, a concentrating photovoltaic device 1 according to the embodiment includes, as main components, a solar cell element (solar cell) 2, a solar cell substrate 3, and an optical element 4. The solar cell element 2 receives and photoelectric-converts sunlight. The solar cell element 2 is mounted on the solar cell substrate 3. The optical element 4 is disposed to face a front side of the solar cell element 2 (i.e., light incident side thereof) and collects the sunlight. In FIG. 1, the reference sign L1 denotes the sunlight incident into the optical element 4, and the reference sign L2 denotes the sunlight collected by the optical element 4.

The optical element 4 is configured by a transparent glass substrate 5 and a sheet-like formed body. The glass substrate 5 is disposed on the light incident side. The sheet-like formed body is bonded to the light emission side of the glass substrate 5 (i.e., the opposite side of the solar cell element 2) and formed of a translucent thermoplastic polymer composition.

The surface of the sheet-like formed body 6 opposite to the glass substrate 5 (i.e., the surface facing the solar cell element 2) is formed with coaxially arranged fresnel lens pattern 6a to collect the incident sunlight on a light-receiving region of the solar cell element 2. That is, the sheet-like formed body 6 formed with the fresnel lens pattern 6a functions as a condenser lens.

Figure 2:
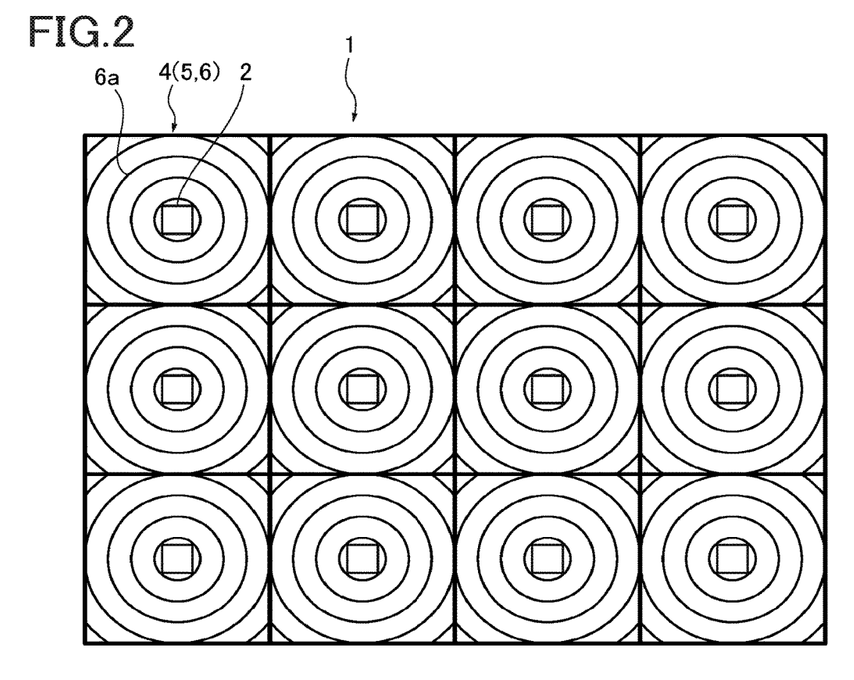
FIG. 2 is a plan view schematically showing the concentrating photovoltaic device according to the embodiment of the present invention from a light-incident side.

As illustrated in FIG. 2, the concentrating photovoltaic device 1 is provided with a plurality of solar cell elements 2 arranged on the solar cell substrate 3 (illustrated in FIG. 1) at a constant interval. Further, the plurality of optical elements 4 is provided on a single plane so as to face the light-receiving regions of the solar cell elements 2 respectively.

Each of the solar cell elements 2 and the optical elements 4 are accurately positioned. A circumferential surface surrounding the solar cell substrate 3 and optical elements 4 is sealed to prevent damp (moisture), dust, and the like from entering the space between the solar cell substrate 3 and the optical elements 4. Note that the numbers and sizes of the solar cell elements 2 and the optical elements 4 disposed facing each other are arbitrarily decided based on the size, installation place, and the like of the concentrating photovoltaic device 1.

Detailed Description of Sheet-Like Formed Body 6

The sheet-like formed body 6 according to the embodiment is formed of a thermoplastic polymer composition including an acrylic block copolymer (A) and an acrylic resin (B) and is excellent in transparency, whether-resistance, flexibility, and the like.

In the thermoplastic polymer composition, the acrylic block copolymer (A) is an acrylic block polymer that includes, within its molecule, at least one structure in which a polymer block (a2) mainly composed of a methacrylic ester unit is bonded to each terminal of a polymer block (a1) mainly composed of an acrylic ester unit. The weight-average molecular weight of the thermoplastic polymer composition is 10,000 to 100,000. The acrylic block copolymer (A) includes an acrylic block copolymer (A1) containing 40 to 80 mass % of the polymer block (a2) and an acrylic block copolymer (A2) containing 10 to 40 mass % of the polymer block (a2). The acrylic resin (B) is mainly formed of a methacrylic ester unit, and the mass ratio [(A)/(B)] of the acrylic block copolymer (A) to the acrylic resin (B) is 97/3 to 10/90.

Note that the acrylic block copolymer (A) includes, within its molecule, at least one structure in which the copolymer block (a2) mainly composed of a methacrylic ester is bonded to each end of the polymer block (a1) mainly composed of an acrylic ester unit. Namely, the acrylic block copolymer (A) includes the structure of (a2)-(a1)-(a2) (the symbols "-" in the structure indicate chemical bonds).

The acrylic resin (B) is mainly composed of a methacrylic ester unit. Here, to improve the transparency and forming workability of the sheet-like formed body made of the thermoplastic polymer composition, the acrylic resin (B) is preferably made of a homopolymer composed of a methacrylic ester or of a copolymer mainly composed of a methacrylic ester unit.

The thermoplastic polymer composition of the embodiment is described in detail in WO2010/055798 A1. The sheet-like formed body made of the thermoplastic polymer composition (the formed body before being formed with the fresnel lens pattern on the surface thereof) is produced by, for example, a well-known T-die molding or an inflation molding.

Further, the fresnel lens pattern 6a is formed on the surface of the sheet-like formed body 6 made of the thermoplastic polymer composition by, for example, a well-known press molding, injection molding, or a photo-polymerization (2P) using a ultraviolet-curable resin.

Next, a bonding method of the glass substrate 5 and the sheet-like formed body 6, will be described. The bonding method is implemented during a method of producing the optical elements 4 (glass base material laminate) according to the embodiment.

Figure 3A:
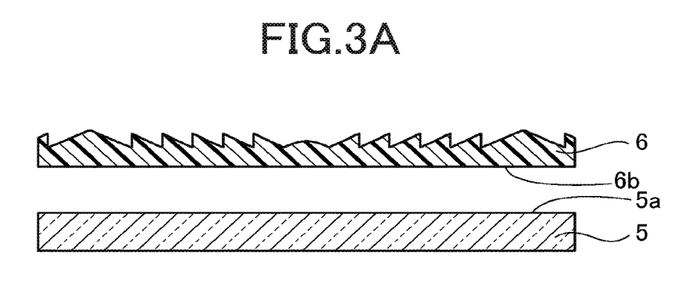
FIG. 3A is a view illustrating each bonding surface of a glass substrate and a sheet-like formed body.

As illustrated in FIG. 3A, the bonding surface (first interface) 6b of the sheet-like formed body 6 is performed with surface treatment (plasma treatment) by irradiating the surface with plasma (active energy) before bonding the glass substrate 5 and the sheet-like formed body 6.

Further, the bonding surface (second interface) 5a of the glass substrate 5 is treated by being coated with a silane coupling agent before bonding the glass substrate 5 and the sheet-like formed body 6.

Figure 3B:
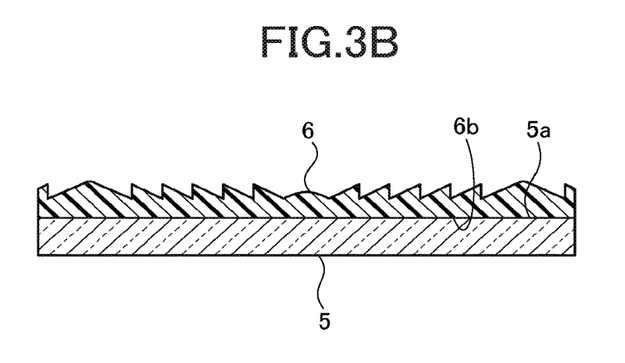
FIG. 3B is a view illustrating a condition of the bonding surface of the glass substrate and the sheet-like formed body.

As illustrated in FIG. 3B, the treated bonding surfaces 5a and 6b of the glass substrate 5 and sheet-like formed body 6 are bonded to each other by, for example, a well-known vacuum pressure-bonding (thermal pressure-bonding) or a vacuum laminating.

By irradiating the bonding surface of a resin molded body containing acrylic ester (sheet-like formed body 6) with plasma (active energy), the ester groups of the acrylic ester on the bonding surface is cleaved and therefore COOH groups and OH groups on the bonding surface increase. Additionally, by adding the silane coupling agent containing amino group and epoxy group between the bonding surfaces 5a and 6b of the glass substrate 5 and sheet-like formed body 6, the amino group and the epoxy group (i.e., the organic functional groups of the silane coupling agent) form an amid bond and an ester bond as chemical bonds, or an hydrogen bond or a salt is formed. As a result, the glass substrate 5 and the sheet-like formed body 6 are firmly bonded to each other.

Although a type of the silane coupling agent should not be limited, it may be preferable to use an agent having a high affinity with COOH groups and OH groups. As an example of such a silane coupling agent, 2-(3,4-epoxycyclohexyl) ethyl trimethoxysilane (KBM-303), 3-glycidoxypropyl methyl dimethoxy run (KBM-402), 3-glycidoxypropyltrimethoxysilane (KBE-402), 3-glycidoxypropyl triethoxysilane (KBE-403), N-2 (aminoethyl)-3-aminopropyl methyl dimethoxy silane (KBM-602), N-2 (aminoethyl)-3-aminopropyltrimethoxysilane silane (KBM-603), 3-aminopropyltrimethoxysilane (KBM-903), 3-triethoxysilyl-N-(1,3-dimethyl-butylidene) propylamine (KBE-9103), N-phenyl-3-aminopropyltrimethoxysilane (KBM-573) of Shin-Etsu Chemical Co., Ltd. may be used.

With this, the bonding surfaces 5a and 6b of the glass substrate 5 and sheet-like formed body 6 are firmly bonded to each other. Therefore, the bonding surfaces 5a and 6b of the glass substrate 5 and sheet-like formed body 6 are not separated or not removed even under a high-temperature and high-humidity environment. Accordingly, it becomes possible to provide optical elements 4 reliably bonded over a long period with high adhesiveness.

Consequently, it becomes possible to satisfactorily receive the light collected by the above optical elements 4 with the light-receiving region of the solar cell elements 2 over a long period even under a high-temperature and high-humidity environment. As a result, it is possible to reliably maintain high power generation efficiency over a long period.

Note that instead of coating the bonding surface of the glass substrate 5 with the silane coupling agent, the bonding surface of the sheet-like formed body 6 with the plasma treatment may be coated with the silane coupling agent.

Further, the gap between the bonding surfaces of the glass substrate 5 and sheet-like formed body 6 may be filled with solvent or water to remove bubbles from the bonding surfaces and then the bonding surfaces are laminated and bonded to each other with a rubber roller while ejecting the liquid remaining between the bonding surfaces. To remove the bubbles, this process is preferably implemented under reduced pressure. It is preferable to use a highly refined solvent to eject the liquid without leaving residue. In case of water, it is preferable to use so-called pure water such as ion exchange water and distilled water.

Further, the sheet-like formed body 6 and/or the glass substrate 5 of the optical element 4 may be configured to contain ultraviolet absorbing agent. With this, the optical elements 4 can absorb ultraviolet rays of sunlight incident thereto. Therefore, it prevents the sheet-like formed body 6 from being colored or from property change caused by ultraviolet rays, thereby maintaining high power generation efficiency for a long period.

In the embodiment, the glass base material laminate represents the optical element in which the sheet-like formed body 6 (condenser lens) having the fresnel lens pattern 6a is bonded to the glass substrate 5 as the resin molded body. However, the present invention is applicable to a resin molded body other than the sheet-like formed body 6 having the fresnel lens pattern 6a.

Embodiment 1

In order to evaluate the adhesion force on the bonding surfaces of the glass substrate 5 and sheet-like formed body 6 of the optical element 4 according to the aforementioned embodiment, an adhesion force evaluation was carried out for the following Examples 1 to 13 and Comparative Examples 1 to 5.

In Example 1, a plasma treatment was performed, under the following condition, on a sheet-like resin molded body having a thickness of 400 am to improve adhesiveness. The resin molded body was composed of a mixture of a block copolymer of methyl methacrylate (MMA) and butyl acrylate and a methacrylic resin (namely, the molded body before being formed with the fresnel lens pattern on the surface thereof).

The surface of the glass substrate which faces the resin molded body was coated by a silane coupling agent manufactured by Shin-Etsu Chemical Co., Ltd. (Product: KBM-903) with a thickness of 40 nm. Further, the glass substrate laminate (glass base material laminate) was formed by vacuum pressure-bonding (thermo pressure bonding) the resin molded body to a transparent glass substrate having a thickness of 2 mm at 180 degree C.

The plasma treatment on the resin molded body was performed as follows.

The plasma treatment was performed by using an atmospheric pressure plasma treatment apparatus (APG-500) manufactured by Kasuga Electric Works Ltd. That is, the plasma treatment was carried out with the supplying air flow amount of 190 NL/min., at a rated output power of 450 to 500 W, and with an irradiation distance of 10 mm. An area to be irradiated by the atmospheric plasma was about 3 $cm^2$.

The irradiation head was moved over the entire resin molded body such that each area was irradiated by the plasma for about one second. The peel strength (adhesion force) of the glass substrate laminate was measured in accordance with a method for measuring 180° peel strength specified by JISK685-2. The result showed that the resin molded body was firmly bonded to the glass substrate such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the resin molded body was firmly bonded to the glass substrate such that the resin molded body was resulted into a material failure without being separated from the glass substrate.

With the aforementioned Example 1, table 1 shows concentrations (coating concentration) of the silane coupling agent (Product: KBM-903) on the glass substrate surfaces, the initial bonding states with different drying temperatures after the vacuum pressure-bonding, and the evaluation results after leaving the glass substrate laminate for 2000 hours under the high-temperature and high-humidity environment (the temperature: 65 degree C., the humidity: 85%).

ture: 65 degree C., the humidity: 85%), and then the adhesion force thereof was measured in the same manner. The result showed that the resin molded body was firmly bonded to the glass substrate such that the resin molded body was resulted into a material failure without being separated from the glass substrate.

In Example 3, the surface of the resin molded body facing the glass substrate was coated to have a thickness of 40 nm by the silane coupling agent instead of the surface of the glass substrate. For the coating, the silane coupling agent was dispersed in a solution including water as a solvent and then hydrolyzed under the temperature of 40 degree C. and humidity of 95%. Apart from the above, the glass substrate laminate was formed in the same manner as that of Example 1.

The peel strength of the glass substrate laminate was measured in accordance with the method for measuring 180° peel strength specified by JISK685-2. The result showed that the resin molded body was firmly bonded to the glass substrate such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhe-

TABLE 1

| COATING CONC. | DRYING TEMP. | INITIAL STATE | | 2000 Hr. | |
|---|---|---|---|---|---|
| | | ADHESION FORCE (N/25 mm) | RESULT | ADHESION FORCE (N/25 mm) | RESULT |
| 0.1% | 100° C. | 53.2 | MATERIAL FAILURE | 65.5 | MATERIAL FAILURE |
| 0.01% | 100° C. | 40.7 | MATERIAL FAILURE | 50.3 | MATERIAL FAILURE |
| 0.1% | Normal Temp. | 45.8 | MATERIAL FAILURE | 56.6 | MATERIAL FAILURE |
| 0.01% | Normal Temp. | 63.8 | MATERIAL FAILURE | 51.1 | MATERIAL FAILURE |

As clearly shown in the evaluation results, the adhesion forces after leaving the glass substrate laminate for 2000 hours under the high-temperature and high-humidity environment (the temperature: 65 degree C., the humidity: 85%) did not dramatically change from the initial adhesion forces even when the drying temperatures after the vacuum pressure-bonding changed. That is, it maintains a high adhesion force such that the resin molded body was resulted into a material failure without being separated from the glass substrate.

In Example 2, another silane coupling agent (Product: KBE-903 manufactured by Shin-Etsu Chemical Co., Ltd.) was used. Apart from the use of the different silane coupling agent, the glass base material laminate of Example 2 was formed in the same manner as that of Example 1.

The peel strength of the glass substrate laminate was measured in accordance with the method for measuring 180° peel strength specified by JISK685-2. The result showed that the resin molded body was firmly bonded to the glass substrate such that the resin molded body was resulted into a material failure without being separated from the glass substrate.

Further, the glass substrate laminate produced under the same condition was left for 2000 hours under a high-temperature and high-humidity environment (the temperasion force thereof was measured in the same manner. The result showed that the resin molded body was firmly bonded to the glass substrate such that the resin molded body was resulted into a material failure without being separated from the glass substrate.

In Example 4, another silane coupling agent (Product KBE-903 manufactured by Shin-Etsu Chemical Co., Ltd.) was used. Apart from the use of the different silane coupling agent, the glass base material laminate of Example 4 was formed in the same manner as that of Example 3, The peel strength of the glass substrate laminate was measured in accordance with the method for measuring 180° peel strength specified by JISK685-2. The result showed that the resin molded body was firmly bonded to the glass substrate such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the resin molded body was firmly bonded to the glass substrate such that the resin molded body was resulted into a material failure without being separated from the glass substrate.

In Example 5, a glass substrate laminate was laminated using a rubber roller through ion exchange water so as to bond the glass substrate and resin molded body that were treated in the same manner as that of Example 1.

The peel strength of the glass substrate laminate was measured in accordance with the method for measuring 180° peel strength specified by JISK685-2. The result showed that the resin molded body was firmly bonded to the glass substrate such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the resin molded body was firmly bonded to the glass substrate such that the resin molded body was resulted into a material failure without being separated from the glass substrate.

In Example 6, a glass substrate laminate was laminated using a rubber roller through isopropyl alcohol so as to bond the glass substrate and resin molded body that were treated in the same manner as that of Example 1.

The peel strength of the glass substrate laminate was measured in accordance with the method for measuring 180° peel strength specified by JISK685-2. The result showed that the resin molded body was firmly bonded to the glass substrate such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the resin molded body was firmly bonded to the glass substrate such that the resin molded body was resulted into a material failure without being separated from the glass substrate.

In Example 7, a glass substrate laminate was laminated using a rubber roller through toluene so as to bond the glass substrate and resin molded body that were treated in the same manner as that of Example 1.

The peel strength of the glass substrate laminate was measured in accordance with the method for measuring 180° peel strength specified by JISK685-2. The result showed that the resin molded body was firmly bonded to the glass substrate such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the resin molded body was firmly bonded to the glass substrate such that the resin molded body was resulted into a material failure without being separated from the glass substrate.

In Example 8, a glass substrate laminate was laminated using a rubber roller through ion exchange water so as to bond the glass substrate and resin molded body that were treated in the same manner as that of Example 2.

The peel strength of the glass substrate laminate was measured in accordance with the method for measuring 180° peel strength specified by JISK685-2. The result showed that the resin molded body was firmly bonded to the glass substrate such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the resin molded body was firmly bonded to the glass substrate such that the resin molded body was resulted into a material failure without being separated from the glass substrate.

In Example 9, a glass substrate laminate was laminated using a rubber roller through isopropyl alcohol so as to bond the glass substrate and resin molded body that were treated in the same manner as that of Example 2.

The peel strength of the glass substrate laminate was measured in accordance with the method for measuring 180° peel strength specified by JISK685-2. The result showed that the resin molded body was firmly bonded to the glass substrate such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the resin molded body was firmly bonded to the glass substrate such that the resin molded body was resulted into a material failure without being separated from the glass substrate.

In Example 10, a glass substrate laminate was laminated using a rubber roller through toluene so as to bond the glass substrate and resin molded body that were treated in the same manner as that of Example 2.

The peel strength of the glass substrate laminate was measured in accordance with the method for measuring 180° peel strength specified by JISK685-2. The result showed that the resin molded body was firmly bonded to the glass substrate such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the resin molded body was firmly bonded to the glass substrate such that the resin molded body was resulted into a material failure without being separated from the glass substrate.

In Example 11, a bonding surface of a resin molded body was treated by using a normal pressure plasma surface treatment apparatus manufactured by Sekisui Chemical Co., Ltd. The plasma treatment was carried out with the irradiation distance between the irradiation head and resin molded body of 3 mm and with an irradiation speed of 3 m/min. A glass substrate laminate was then laminated using a rubber roll through a mixed solution of 1 pt. wt. of the silane coupling agent of Shin-Etsu Chemical Co., Ltd. (Product: KBE-903), 1 pt. wt. of ultrapure water, and 98 pts. wt. of ethanol so as to bond the resin molded body and glass substrate. Here, the surface of the glass substrate was not coated by a silane coupling agent.

The peel strength of the glass substrate laminate was measured in accordance with the method for measuring 180° peel strength specified by JISK685-2. The result showed that the resin molded body was firmly bonded to the glass substrate such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the resin molded body was firmly bonded to the glass substrate such that the resin molded body was resulted into a material failure without being separated from the glass substrate.

In Example 12, a bonding surface of a resin molded body was treated by using a normal pressure plasma surface treatment apparatus manufactured by Sekisui Chemical Co., Ltd. The plasma treatment was carried out with the irradiation distance between the irradiation head and resin molded body of 3 mm and with an irradiation speed of 3 m/min. A glass substrate laminate was then laminated using a rubber roll through a mixed solution of 1 pt. wt. of the silane coupling agent of Shin-Etsu Chemical Co., Ltd. (Product: KBE-903), 3 pts. wt. of ultrapure water, and 96 pts. wt. of ethanol so as to bond the resin molded body and glass substrate. Here, the surface of the glass substrate was not coated by a silane coupling agent.

The peel strength of the glass substrate laminate was measured in accordance with the method for measuring 180° peel strength specified by JISK685-2. The result showed that the resin molded body was firmly bonded to the glass substrate such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the resin molded body was firmly bonded to the glass substrate such that the resin molded body was resulted into a material failure without being separated from the glass substrate.

In Example 13, a bonding surface of a resin molded body was treated by using a normal pressure plasma surface treatment apparatus manufactured by Sekisui Chemical Co., Ltd. The plasma treatment was carried out with the irradiation distance between the irradiation head and resin molded body of 3 mm and with an irradiation speed of 3 m/min. A glass substrate laminate was then laminated using a rubber roll through a mixed solution of 1 pt. wt. of the silane coupling agent of Shin-Etsu Chemical Co., Ltd. (Product: KBE-903) and 99 pts. wt. of ultrapure water so as to bond the resin molded body and glass substrate. Here, the surface of the glass substrate was not coated by a silane coupling agent.

The peel strength of the glass substrate laminate was measured in accordance with the method for measuring 180° peel strength specified by JISK685-2. The result showed that the resin molded body was firmly bonded to the glass substrate such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the resin molded body was firmly bonded to the glass substrate such that the resin molded body was resulted into a material failure without being separated from the glass substrate.

In Comparative Example 1, a glass substrate laminate was formed in a similar manner to that of Example 1, but a plasma treatment was not performed on the resin molded body of Example 1.

The peel strength of the glass substrate laminate was measured in accordance with the method for measuring 180° peel strength specified by JISK685-2. The result showed that the adhesion force was 33.2 N/25 mm and the resin molded body was partially separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the adhesion force was further decreased to 5.5 N/25 mm and the resin molded body was easily separated from the glass substrate.

In Comparative Example 2, a glass substrate laminate was formed in a similar manner to that of Example 1, but a plasma treatment was not performed on the resin molded body of Example 2.

The peel strength of the glass substrate laminate was measured in accordance with the method for measuring 180° peel strength specified by JISK685-2. The result showed that the adhesion force was 48.9 N/25 mm and the resin molded body was firmly bonded to each other such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the adhesion force was decreased to 2.5 N/25 mm and the resin molded body was easily separated from the glass substrate.

In Comparative Example 3, a glass substrate laminate was composed of a glass substrate similar to Example 1 but without the silane coupling treatment and a resin molded body with the plasma treatment similar to Example 1. Apart from the above, the glass substrate and resin molded body were bonded to each other in the same manner as that of Example 1.

The peel strength of the glass substrate laminate was measured in accordance with the method for measuring 180° peel strength specified by JISK685-2. The result showed that the adhesion force was 38.3 N/25 mm and the resin molded body was firmly bonded to each other such that the resin molded body was resulted into a material failure without being separated from the glass substrate.

Further, the glass substrate laminate produced under the same condition was left for 2000 hours under a high-temperature and high-humidity environment (the temperature: 65 degree C., the humidity: 85%), and then the adhesion force thereof was measured in the same manner. The result showed that the adhesion force was decreased to 0.5 N/25 mm and the resin molded body was easily separated from the glass substrate.

In Comparative Example 4, a glass substrate laminate was composed of a glass substrate similar to Example 1 but without the silane coupling treatment and a resin molded body similar to Example 1 but without the plasma treatment. Apart from the above, the glass substrate and resin molded body were bonded to each other in the same manner as that of Example 1.

In the glass substrate laminate of Comparative Example 4, the glass substrate and resin molded body were not bonded and easily separated from each other.

In Comparative Example 5, a glass substrate laminate was formed in the similar manner to Example 1, but was formed of a sheet-like resin molded body with a thickness of 500 μM composed of COMOGLASS™ (Product: H150). COMOGLASS is manufactured by Kuraray Co., Ltd. and contains methyl methacrylate (MMA) and a rubber component.

In Comparative Example 5, the glass substrate and resin molded body were not bonded and easily separated from each other.

As mentioned above, with the present inventions, it is possible to firmly bond the bonding surface between the glass base material and the resin molded body (sheet-like formed body). As a result, it becomes possible to provide a glass substrata laminate (optical element) that is reliably bonded with high adhesiveness such that the bonding surface between the glass base material and the resin molded body will not be separated over a long period even under a high-temperature and high-humidity environment.

Further, the concentrating photovoltaic device of the present invention is capable of maintaining high power generation efficiency over a long period under a high-temperature and high-humidity environment by using the optical element reliably bonded by a high adhesion force.

REFERENCE SIGNS LIST

1 Concentrating photovoltaic device
2 Solar cell element
3 Solar cell substrate
4 Optical element
5 Glass substrate (Glass base material)
5a Bonding surface
6 Sheet-like formed body
6a Fresnel lens pattern
6b Bonding surface

The invention claimed is:

1. A method of producing a glass base material laminate of a resin molded body made of a thermoplastic polymer composition and laminated on a glass base material, the method comprising:
performing surface treatment on a first interface of the thermoplastic polymer composition facing the glass base material by irradiating the first interface with active energy; and
bonding the first interface of the thermoplastic polymer composition to a second interface of the glass base material facing the thermoplastic polymer composition by using a silane coupling agent as a crosslinking agent, wherein
the thermoplastic polymer composition comprises an acrylic block copolymer (A) or the acrylic block copolymer (A) and an acrylic resin (B) mainly composed of a methacrylic ester unit,
the acrylic block copolymer (A) comprises at least one structure in which a polymer block (a2) mainly composed of a methacrylic ester unit is bonded to each terminal of a polymer block (a1) mainly composed of an acrylic ester unit, and
the thermoplastic polymer composition has a weight-average molecular weight of from 10,000 to 100,000.

2. The method of claim 1, wherein the resin molded body is a sheet-like formed body, and
the sheet-like formed body is formed of an organic resin, one surface of which has an optical functional pattern and the other surface of which is bonded to the glass base material.

3. The method according to claim 2, further comprising:
performing a silane coupling treatment using the silane coupling agent on the second interface of the glass base material before the bonding, and
bonding the second interface of the glass base material and the first interface of the thermoplastic polymer composition by thermal pressure-bonding.

4. The method according to claim 2, further comprising:
performing a silane coupling treatment using the silane coupling agent on the second interface of the glass base material before the bonding,
filling a gap between the second interface of the glass base material and the first interface of the thermoplastic polymer composition with liquid, and
laminating and bonding the second interface and the first interface while ejecting the liquid remaining between the bonding surfaces.

5. The method according to claim 2, further comprising:
filling a gap between the second interface of the glass base material and the first interface of the thermoplastic polymer composition with liquid containing the silane coupling agent, and
laminating and bonding the second interface and the first interface while ejecting the liquid remaining between the bonding surfaces.

6. The method according to claim 2, further comprising:
filling a gap between the second interface of the glass base material and the first interface of the thermoplastic polymer composition with liquid, wherein the first interface of the thermoplastic polymer composition comprises the silane coupling agent, and
laminating and bonding the second interface and the first interface while ejecting the liquid remaining between the bonding surfaces.

7. The method according to claim 1, wherein the thermoplastic composition comprises the acrylic block copolymer (A).

8. The method according to claim 7, wherein the acrylic block copolymer (A) comprises, in reacted form, methyl methacrylate and butyl acrylate.

9. The method according to claim 1, wherein the thermoplastic composition comprises the acrylic block copolymer (A) and the acrylic resin (B).

10. The method according to claim 9, wherein the acrylic block copolymer (A) comprises, in reacted form, methyl methacrylate and butyl acrylate, and the acrylic resin (B) comprises a methacrylic resin.

11. The method according to claim 1, further comprising:
performing a silane coupling treatment using the silane coupling agent on the second interface of the glass base material before the bonding, and
bonding the second interface of the glass base material and the first interface of the thermoplastic polymer composition by thermal pressure-bonding.

12. The method according to claim 1, further comprising:
performing a silane coupling treatment using the silane coupling agent on the second interface of the glass base material before the bonding, filling a gap between the second interface of the glass base material and the first interface of the thermoplastic polymer composition with liquid, and laminating and bonding the second interface and the first interface while ejecting the liquid remaining between the bonding surfaces.

13. The method according to claim 1, further comprising:

filling a gap between the second interface of the glass base material and the first interface of the thermoplastic polymer composition with liquid containing the silane coupling agent, and laminating and bonding the second interface and the first interface while ejecting the liquid remaining between the bonding surfaces.

14. The method according to claim 1, the method further comprising:

filling a gap between the second interface of the glass base material and the first interface of the thermoplastic polymer composition with liquid, wherein the first interface of the thermoplastic polymer composition comprises the silane coupling agent, and laminating and bonding the second interface and the first interface while ejecting the liquid remaining between the bonding surfaces.

15. The method according to claim 1, wherein the surface treatment is a plasma treatment.

16. The method according to claim 1, wherein the silane coupling agent comprises 3-aminopropyltrimethoxysilane.

* * * * *